(12) United States Patent
Choa

(10) Patent No.: US 7,076,170 B2
(45) Date of Patent: Jul. 11, 2006

(54) SYSTEM AND METHOD FOR GENERATING ANALOG TRANSMISSION SIGNALS

(75) Inventor: Fow-Sen Choa, Baltimore, MD (US)

(73) Assignee: University of Maryland, Baltimore County, Baltimore, MD (US)

( * ) Notice: Subject to any disclaimer, the term of this patent is extended or adjusted under 35 U.S.C. 154(b) by 628 days.

(21) Appl. No.: 10/143,809

(22) Filed: May 14, 2002

(65) Prior Publication Data

US 2003/0002120 A1    Jan. 2, 2003

Related U.S. Application Data

(60) Provisional application No. 60/290,946, filed on May 14, 2001.

(51) Int. Cl.
*H04B 10/00* (2006.01)
*H04B 10/04* (2006.01)

(52) U.S. Cl. ................ 398/115; 398/76; 398/183; 398/186; 398/187; 385/24; 385/27

(58) Field of Classification Search .............. 398/76, 398/115, 141–170, 182–201; 385/24–27
See application file for complete search history.

(56) References Cited

U.S. PATENT DOCUMENTS

| | | | | |
|---|---|---|---|---|
| 5,212,579 | A * | 5/1993 | Huber et al. | .......... 398/76 |
| 5,742,714 | A * | 4/1998 | Byron | .......... 385/27 |
| 6,081,361 | A * | 6/2000 | Adams et al. | .......... 398/201 |
| 6,104,851 | A | 8/2000 | Mahgerefteh | |
| 6,175,672 | B1 * | 1/2001 | Newberg et al. | .......... 385/24 |
| 6,204,951 | B1 | 3/2001 | Coward et al. | |
| 6,414,775 | B1 * | 7/2002 | Pedersen | .......... 398/177 |

OTHER PUBLICATIONS

T. Chau et al., "Long Wavelength Velocity-Matched Distributed Photodetectors for RF Fibre Optic Links", IEEE Electronics Letters, Jul. 1998, vol. 34, No. 14, pp. 1422-1424.

(Continued)

*Primary Examiner*—Dzung Tran
(74) *Attorney, Agent, or Firm*—Fleshner & Kim LLP

(57) ABSTRACT

An RF-lightwave transmitter performs successive conversions of an information-bearing input signal in order to generate an output signal suitable for transmission in a wireless communications system. The transmitter includes a high-efficiency FM laser connected to a FM discriminator. In operation, the laser converts an RF signal into a frequency-modulated optical signal, and the discriminator converts this signal into an amplitude-modulated optical signal. The discriminator performs its conversion using a high slope-efficiency linear transfer function which ensures that the AM optical signal varies in accordance with a desired operational performance. The transmitter also includes a photodiode which converts the AM signal output from the optical discriminator back into an RF signal for transmission. Experimental results demonstrated that a transmitter of this type is able to realize greater than 10 dB RF insertion gain at less than 0 dBm optical power, with a high spurious-free dynamic range and low noise. A signal processor embodied within the transmitter may be used in a purely optical communication systems or may be used for other types of RF-photonics applications such as those expected for use in next-generation systems.

34 Claims, 7 Drawing Sheets

OTHER PUBLICATIONS

R. B. Welstand et al., "Dual-Function Electroabsorption Waveguide Modulator/Detector for Optoelectronic Transceiver Applications", IEEE Photonics Technology Letters, vol. 8, No. 11, Nov. 1996, pp. 1540-1542.

P. S. Spencer, et al., "Coupled-Cavity Effects in FM Semiconductor Lasers", Journal of Lightwave Technology, vol. 17, No. 6, Jun. 1999, pp. 1072-1078.

S. E. Harris et al., "Theory of FM Laser Oscillation", IEEE Journal of Quantum Electronics, Sep., pp. 245-262.

X. Huang et al., "Monolithically Integrated Quantum-Confined Stark Effect Tuned Laser with Uniform Frequency Modulation Response", IEEE Photonics Technology Letters, vol. 10, No. 12, Dec. 1998, pp. 1697-1699.

T. Tanbun-Ek et al., "Broad-Band Tunable Electroabsorption Modulated Laser for WDM Application", IEEE Journal of Selected Topics in Quantum Electronics, vol. 3, No. 3, Jun. 1997, pp. 960-967.

* cited by examiner

SYSTEM AND METHOD FOR GENERATING ANALOG TRANSMISSION SIGNALS

CROSS-REFERENCE TO RELATED APPLICATIONS

The present application claims the benefit of provisional U.S. Patent Application Ser. No. 60/290,946, filed on May 14, 2001. The contents of this provisional application is incorporated herein by reference.

BACKGROUND OF THE INVENTION

1. Field of the Invention

This invention generally relates to processing signals, and more particularly to a system and method for generating analog signals for transmission in a communications, a photonics-based system, or any other system which requires analog signal processing.

2. Background of the Related Art

In the broadest sense, a communications transmitter operates by modulating a carrier wave with an input (e.g,. voice) signal. The modulated signal is then transmitted at a predetermined frequency to a receiver, where it is detected and demodulated so that the original signal may be recovered. The recent demand for integrated voice and data services has given birth to new modulation schemes designed to make the most efficient use of bandwidth, while simultaneously achieving fast transmission rates. Today, these modulation schemes are implemented in both digital and analog form.

Analog transmissions systems have been performed using a combination of fiber-optic and wireless technologies. Conventional systems of this type convert information-bearing RF signals into amplitude-modulated optical signals. These so-called analog fiber-optic links have been shown to have great advantages over microwave links in terms of their bandwidth and immunity to electromagnetic interference. These links also require smaller and lighter their hardware than their microwave-counterparts.

For all their advantages, analog fiber-optic links have at least one drawback which significantly degrades their performance. This drawback comes in the form of a large insertion loss, which results from an inefficient conversion of RF signals to amplitude-modulated optical signals.

Several approaches have been taken in an attempt to overcome the drawbacks of analog fiber-optic links. One approach involves the use of high-saturation power detectors and low V-$\pi$ modulators. This approach has proven undesirable because a balancing scheme must be used which increases the complexity of the system. This approach is also deficient because an improved weakness of loss is required without introducing degradations to other figures of merit such as noise figures and spurious-free dynamic range ($_{Drsp}$).

Another approach, disclosed in U.S. Pat. No. 6,331,991, converts a frequency-modulated input signal into an amplitude-modulated signal prior to transmission. This conversion is performed using a transfer function which assigns frequency variations in the input signal to one of two discrete amplitude values. It is clear that the approach taken in this patent therefore uses a non-linear transfer function which performs a digital conversion. A transfer function of this type has proven undesirable for many communications applications involving analog links.

In view of the foregoing discussion, it is clear that there is a need for a system and method which generates analog transmission signals without realizing the drawbacks of conventional systems, and moreover which does so without realizing an insertion loss and without using a non-linear transfer function which has been shown to be unsuitable for use in many analog transmission applications.

The above references are incorporated by reference herein where appropriate for appropriate teachings of additional or alternative details, features and/or technical background.

SUMMARY OF THE INVENTION

It is one object of the present invention to provide a system and method for generating analog transmission signals in a manner which overcomes the drawbacks of conventional transmission systems and methods.

It is another object of the present invention to achieve the aforementioned object by using a linear transfer function which converts a frequency-modulated signal into an amplitude-modulated output signal prior to transmission.

It is another object of the present invention to provide an analog RF-lightwave transmitter which performs the aforementioned conversion on optical signals, and which then transforms the converted amplitude-modulated optical signal back into an RF signal prior to transmission.

It is another object of the present invention to provide an analog RF transmitter which realizes an insertion gain, and at the same time high spurious-free dynamic range with low noise and power requirements.

The foregoing and other objects of the invention are achieved by providing a signal processor which performs two signal conversions. First, the processor converts an RF signal into a frequency-modulated optical signal using a modulating laser, and second the processor converts the frequency-modulated optical signal into an amplitude-modulated optical signal based on a linear transfer function tuned to a desired bandwidth. In order to perform the second conversion, a discriminator is used which effectively functions as a band pass filter. Conversion of the FM optical signal to the AM optical signal may be performed using one of the rising and falling edges of the filter, with the rising edge being preferable.

The present invention is also an RF-lightwave transmitter which uses the signal processor described above to generate a transmission signal in a communications system. The transmitter includes an FM laser which frequency modulates a carrier signal with an RF input signal to produce a modulated optical signal, an FM discriminator which converts frequency variations in the modulated optical signal into amplitude variations in order to generate an amplitude-modulated optical signal, and a detector unit which transforms the amplitude-modulated optical signal back into an RF signal for transmission to a receiver. The laser is preferably a high-FM-efficiency laser formed by selective-area-growth techniques. To obtain efficient modulation, the output facet of the laser may lack an anti-reflection coating.

In the transmitter described above, the discriminator (acting as a band pass optical filter) performs its conversion using a high-slope-efficiency transfer function which demonstrates a linear response within a desired bandwidth. A transfer function of this type is advantageous for various fiber-optic links and RF-photonics applications and has not been used in conventional analog RF-link transmitters. Also, unlike conventional transmitters, which realize an insertion loss that compromises performance, the transmitter of the present invention achieves an insertion gain. In fact, experimental measurements and theoretical calculations have confirmed that a transmitter constructed in accordance with the present invention can, for example, achieve greater than 10 dB RF insertion gain at less than 0 dBm optical power, and with a high spurious-free dynamic range ($DR_{sp}$) and low noise. Such performance is superior in the art.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The present invention is, in one respect, a signal processor and method for generating modulated signals in an optical system. The present invention is, in another respect, a lightwave transmitter which may use the aforementioned signal processor for generating RF signals in a wireless communications system.

Figure 1:
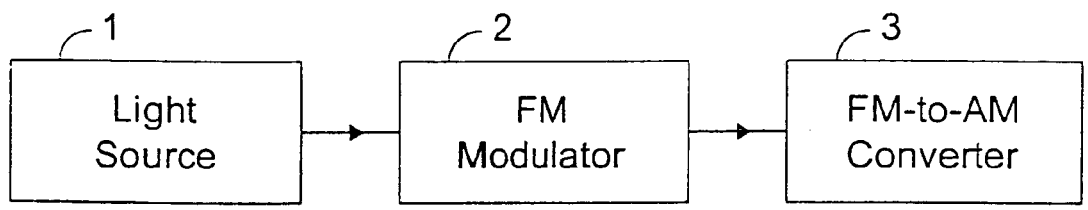
FIG. 1 is a diagram showing a first embodiment of the system of the present invention.

Referring to FIG. 1, a first embodiment of the signal processor of the present invention includes a light source 1, an FM modulator 2, and a linear FM-to-AM converter 3. The light source may be, for example, a semiconductor laser or a laser diode. The FM modulator modulates the frequency of a carrier signal with an input signal to produce an FM optical signal. Although the modulator is shown as being separate from the light source, those skilled in the art can appreciate that the modulator may be incorporated within the laser if desired. The linear FM-to-AM converter converts frequency variations in the optical signal output from the modulator into amplitude variations, thereby generating an amplitude-modulated optical signal. Unlike conventional systems, the converter of the invention performs this function using a linear transfer function, which preferably has a high-slope efficiency for ensuring that the output optical signal has an amplitude which varies within a range suitable for use in the particular application to which the invention is being applied.

Figure 2:
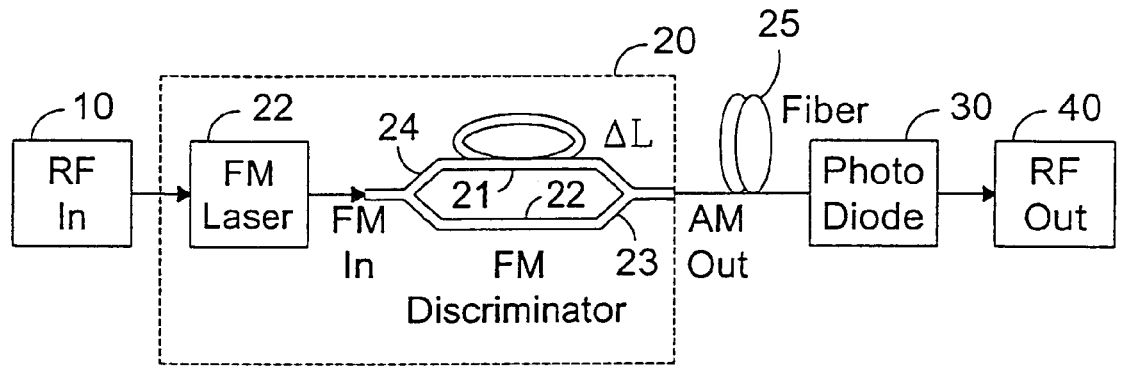
FIG. 2 is a diagram showing a second embodiment of the system of the present invention specifically applied to a wireless communications system.

Referring to FIG. 2, a second embodiment of the system of the present invention is implemented within or in connection with a transmitter of a communications system. The second embodiment includes a unit 10 for generating an RF signal, an optical signal-generating unit 20 connected to the RF signal-generating unit, and a conversion unit 30 which may include a photodetector for converting an output of the optical signal-generating unit into an RF signal for transmission from unit 40. If desired, a number of additional signal-processing features be included within this system in order to meet, for example, desired signal specifications. For example, an amplifier 25 may be connected between the optical-signal generating unit and the conversion unit for the purpose of increasing the gain of the signal output from the optical signal-generating unit. This amplifier is preferably an erbium-doped optical fiber, however those skilled in the art will appreciate that any known amplifier may be used.

The optical-signal generating unit includes the signal processing arrangement described in accordance with the first embodiment of the invention. When implemented in accordance with the second embodiment, the optical-signal generating unit includes an FM laser unit 22 connected to a linear FM-to-AM converter unit 24.

The FM laser unit may be an integrated distributed feedback (DFB) laser/modulator device. This laser is preferable in communications applications because of its ability to produce an FM response, and because it is wavelength-sensitive, thereby making it a tunable laser.

Figure 3:
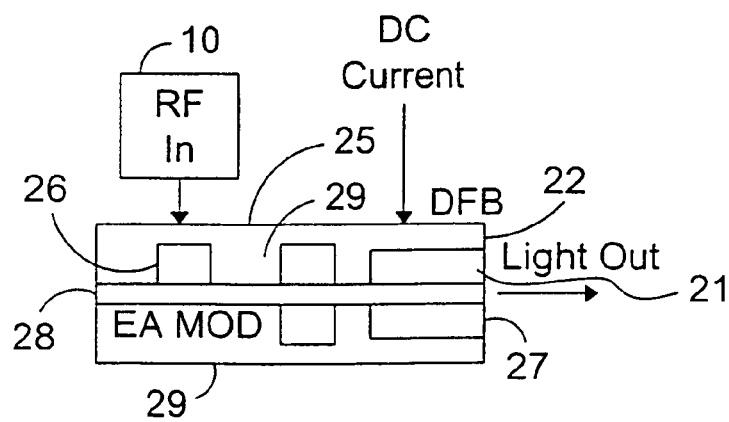
FIG. 3 is a diagram showing the structure of an FM laser unit which may be used for generating optical signals in accordance with the second embodiment of the system of the present invention.

FIG. 3 shows an exemplary structure of the FM laser unit of the invention. This unit includes a semiconductor laser 25, a frequency-modulation unit 26, and circuit 27 for receiving a gain signal (e.g., a DC current) for pumping the laser above a predetermined threshold in order to ensure proper operation. In terms of structure, the laser may be an InGaAsP laser formed from an active region 28 situated between two cladding layers 29. When stimulated by the gain control signal, the active region emits light of one or more predetermined modes (frequencies). In the context of the invention, this light serves as the carrier signal for the modulation unit, which modulates the frequency of the carrier signal using the RF signal output from unit 10.

For communications applications, the laser wavelength may be selected to be 1.55 µm and the modulator material emission peak may be 1.48 µm. Preferably, the device is fabricated using selective-area-growth techniques performed, for example, in one primary growth and two regrowths. The modulator output facet 21 may or may not be coated with an anti-reflection (AR) coating. When the modulator output facet is not AR-coated, the reflectivity from the facet will contribute to the phase change of the laser to thereby produce a highly efficient FM modulation with very small additional AM modulation.

The FM-to-AM converter unit converts the frequency-modulated optical signal from the laser unit into an amplitude-modulated optical signal. In accordance with the present invention, the FM-to-AM converter unit performs this function using a linear transfer function, which preferably has a high slope-efficiency for ensuring that the amplitude of the output optical signal varies within a range suitable for use in the particular application to which the invention is being applied.

Figure 4:
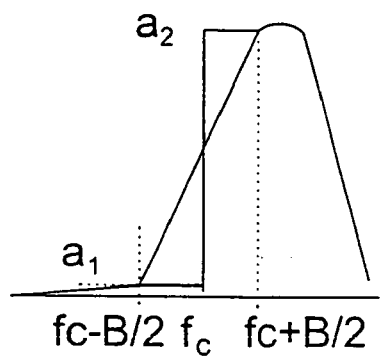
FIG. 4 is a graph showing a linear transfer function used by an optical signal-converting circuit in accordance with the present invention.

FIG. 4 is a graph showing a linear transfer function which may be used in accordance with the present invention. In this graph, frequency along the horizontal axis is plotted against amplitude along the vertical axis. As shown, frequencies which lie within a bandwidth of between $f_c-B/2$ and $f_c+B/2$ are linearly transformed into amplitude values corresponding to coefficients $a_1$ and $a_2$. With this transfer function, the converter of the invention effectively functions as a band pass optical filter which passes only those frequencies of the input FM optical signal which lie within B/2 on either side of a center frequency $f_c$. The bandwidth B, center frequency $f_c$, and amplitude coefficients $a_1$ and $a_2$ may be selected by a system designer in order to conform the transmitter to a desired performance or range of operation. In accordance with one aspect of the invention, the bandwidth B may be approximately 20 Ghz.

From the foregoing discussion, it is apparent that the FM-to-AM converter unit operates as a linear FM discriminator. This discriminator may be implemented in various forms. In FIG. 2, the discriminator is illustratively shown as being an interferometer which branches the FM optical signal from the laser unit along two optical fibers 21 and 22. The difference between the optical lengths AL of these fibers enables the interferometer to perform the above-described filter function when the two signals are combined at point 23. Examples of interferometers which can perform this filter/conversion function include Mach-Zender and Fabry-Perot interferometers. Those skilled in the art can appreciate that other devices may also be used to perform this function. These devices include but are in no way limited to zero-crossing FM demodulators, phase-shift (delay line) FM demodulators, PLL discriminators, or even a differentiator followed by an envelope detection circuit.

Figure 5:
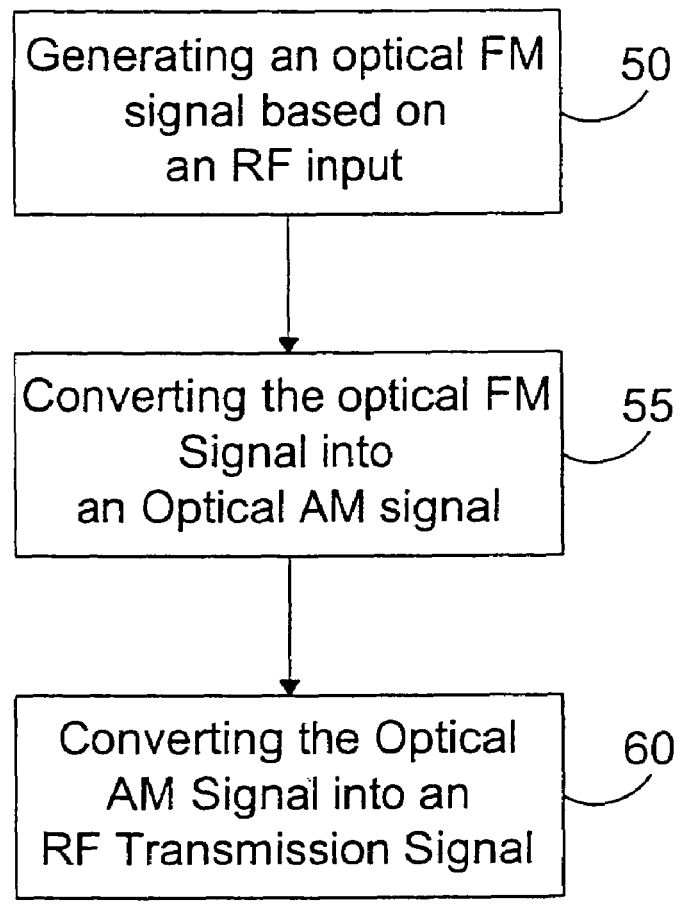
FIG. 5 is a flow chart showing steps included in the method of the present invention for generating transmission signals in a communications system.

FIG. 5 is a flow chart showing steps included in the method of the present invention for generating a transmission signal in a communications system. The method includes as an initial step outputting a frequency-modulated optical signal from the FM laser unit. (Step 50). As previously discussed, the FM signal may be generated by frequency modulating a carrier signal within input RF signal, which in a communications system may be, for example, a voice or data signal. The signal output from the laser unit may be expressed in mathematical terms as follows:

$$S_{fm}=A\cos 2\pi(f_c+K\cdot x(t))t \quad (1)$$

where x(t) is the RF signal in current (voltage), K is the FM efficiency of the FM laser in Hz/A Hz/V).

A second step of the method includes converting the FM optical signal from the laser unit into an AM optical signal using the linear converter of the present invention. (Block 55). As previously described, this converter functions as a band pass optical filter in accordance with a linear transfer function such as shown in FIG. 4. In performing this function, one of the edges (e.g,. the rising edge) of the filter may be used to perform the FM-to-AM conversion. The normalized transfer function at the rising edge may be expressed as follows:

$$T(f) = (f - f_c)\frac{a_2 - a_1}{B} + \frac{a_2 + a_1}{2} \quad (2)$$

where $f_c$ is the carrier frequency, $f=f_c+Kx(t)$ is the instant frequency after modulation, B is the usable bandwidth of the optical filter, and $a_1$ and $a_2$ are transfer coefficients at $f_c+B/2$ and $f_c-B/2$.

The optical power of the signal output from the filter may be expressed as follows:

$$P_0 T = P \cdot L \cdot T(f) = PL \cdot \frac{a_2 + a_1}{2} + PL \cdot \frac{a_2 - a_1}{B} \cdot K \cdot x(t) \quad (3)$$

where P is the optical power at the transmitter and L is the insertion loss (in units of –dB). The RF current from the photodiode of conversion unit 30 is $I=PLRKx(t)(a_2-a_1)/B$, where R is the response of the photodiode. The RF current gain is $g_i=RPLK(a_2-a_1)/B$, and the RF voltage gain is $g_v=g_i*R_{out}/R_{in}$. The power gain is given by:

$$G=g_i^2*R_{out}/R_{in}=(RPLK(a_2-a_1)/B)^2 \quad (4)$$

where $R_{out}$ and $R_{in}$ are load resistance at the RF output and input respectively.

From the foregoing equations, it is clear that the RF gain is increased with optical power, FM efficiency, and the filter slope efficiency (i.e., $(a_2-a_1)/B)$). However, B is limited by Carson's rule, i.e., B must be larger than $2f_m$. When the RF frequency and optical power (P) are given, the slope efficiency is limited by Carson's rule and the FM efficiency (K) is the most important factor in determining the RF gain. Compared with the AM modulated case, where the modulated signal is:

$$S_{AM}=A_0(1+\beta x(t))\cos(\omega_c t) \quad (5)$$

the RF current gain is $2RPL\beta$ and the power gain is $G_{am}=(2RPL\beta)^2 R_{out}/R_{in}$ where $\beta$ is the modulation index ($\beta<1$).

A third step of the method includes converting the AM optical signal output from the linear converter to an RF signal for transmission. (Block 60). This step may be performed by a photodiode or other conventional detector.

The system of the present invention outperforms conventional transmitters in a number of respects. For example, inserting the optical signal-generating unit of the invention into an RF transmitter, as shown in FIG. 2, produces an insertion gain, which, in turn, improves the quality and reliability of the signal transmissions. This is in stark contrast to conventional transmitters which often realize an insertion loss which must be compensated for in the form of increased design complexity and/or expense to the manufacturer.

The system of the invention also consumes significantly less power compared with conventional RF transmitters, because it takes must less power to change the frequency of the FM laser unit than to change the power of the laser itself in order to meet desired performance criteria. Also, integrating the FM discriminator with the FM laser produces a high-efficiency transmission scheme which is less expensive to implement than conventional RF transmitters.

The system of the present invention may be subject to several modifications. For example, in FIG. 2 the linear FM-to-AM converter is shown as being an element separate from the FM laser unit. If desired, these two elements may be combined into a single unit for purposes of improving the integration of the system. Also, the system of the invention may function as a control circuit located either within or connected to a signal transmitter. The processor of the invention may also be incorporated as a built-in modulator in a laser for purposes of performing optical transmissions.

In terms of performance, the Inventor has determined that an RF-lightwave transmitter constructed in accordance with the present invention may provide greater than 10 dB RF insertion gain at less than 0 dBm optical power with high spur-free dynamic range ($DR_{sp}$) and low-noise characteristics in an analog fiber link. This performance level has proven to be superior to conventional RF transmitters, thereby making the invention ideal for use in various communications and RF photonics applications.

In assessing the performance of the invention, FM efficiency may be measured by inputting into the FM laser a single-frequency RF signal represented by $x(t)=A_m \cos(\omega_m t)$. The spectrum of the frequency modulated signal output from the laser may therefore be given by:

$$S(\omega) = A \sum_{n=-\infty}^{\infty} J_n(\beta)[\delta(\omega - \omega_c - n\omega_m) + \delta(\omega + \omega_c + n\omega_m)] \quad (6)$$

where $\beta = KA_m/\omega_m$ and $J_m\beta$ is an $n^{th}$ order Bessell function.

Figure 6:
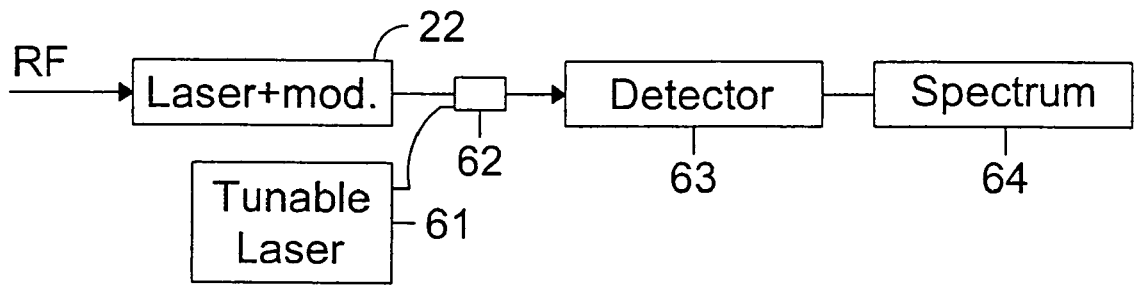
FIG. 6 is a diagram of a circuit arrangement which may be used to measure the FM efficiency of the system of the present invention.

FIG. 6 shows a circuit arrangement that may be used to measure the FM efficiency of the system of the present invention in accordance with the aforementioned equations. This arrangement includes a externally tunable laser 61, a mixer 62, a detector 63, and a spectrum analyzer 64. In operation, the mixer mixes the signal output from the FM laser with the output from laser 61 with very small linewidth. The beating signal is detected by the detector and sent into the analyzer for purposes of measuring the spectrum of the FM laser. The RF spectrum may then be displayed for viewing. If the ratio of first line to second line of the FM spectrum is given by $(J_1(\beta)/J_2(\beta))^2$, the value of $\beta$ may be calculated by measuring this ratio.

The ratio of the carrier spectrum ($J_0$) to the first FM spectrum ($J_1$) to obtain the $\beta$ may also be measured. In order to obtain a stable measurement, a frequency locking circuit may be used to lock the RF center frequency at the frequency difference of the two lasers. The advantage of measuring $J_1/J_2$ using direct detection is that a very stable RF spectrum may be obtained in the spectrum analyzer. The FM efficiency of the invention was measured at different frequencies and RF powers, and then the RF gain and spurious free dynamic range was measured for the combined transmitter at different RF frequencies.

Figure 7:
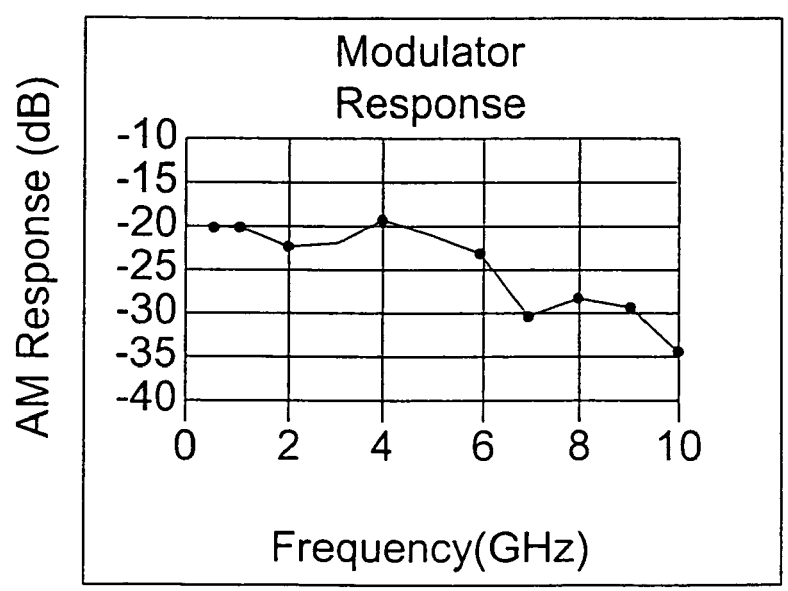
FIG. 7 is a graph showing a modulator small-signal AM modulation response obtained for the present invention.

FIG. 7 is a graph showing the modulator small-signal AM modulation response obtained for the invention. In this graph, the −3 dB frequency is around 6 Hz. When the modulator is driven by an RF signal, the frequency spectra of the laser start to expand with an increase of modulated RF power.

Figure 8A:
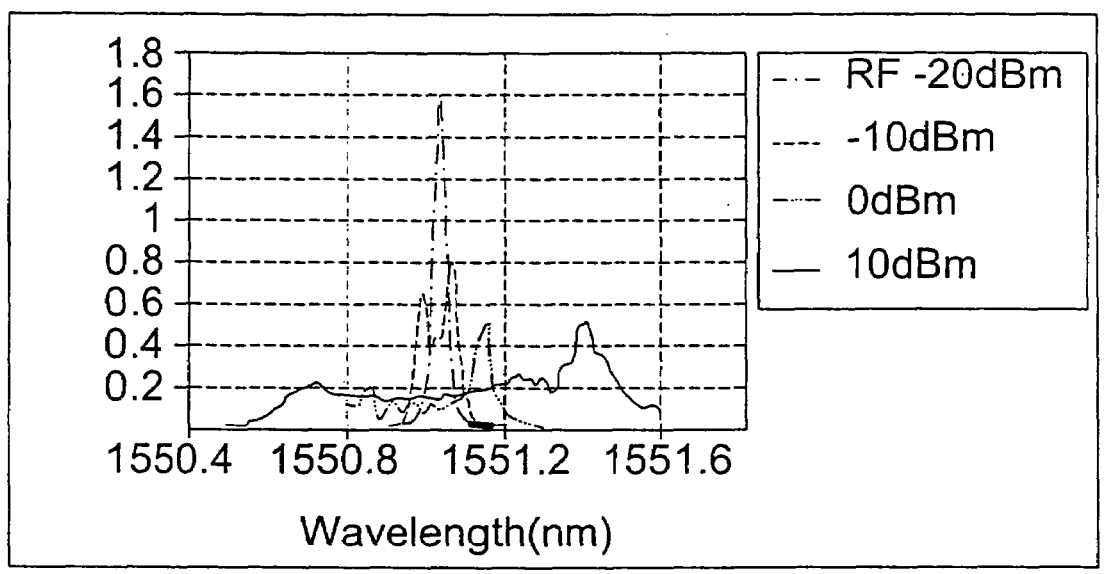
FIGS. 8(a)–8(c) are graphs showing the optical FM spectra of a laser configured in accordance with the present invention for different continuous wave (cw) modulation power and frequencies.
Figure 8B:
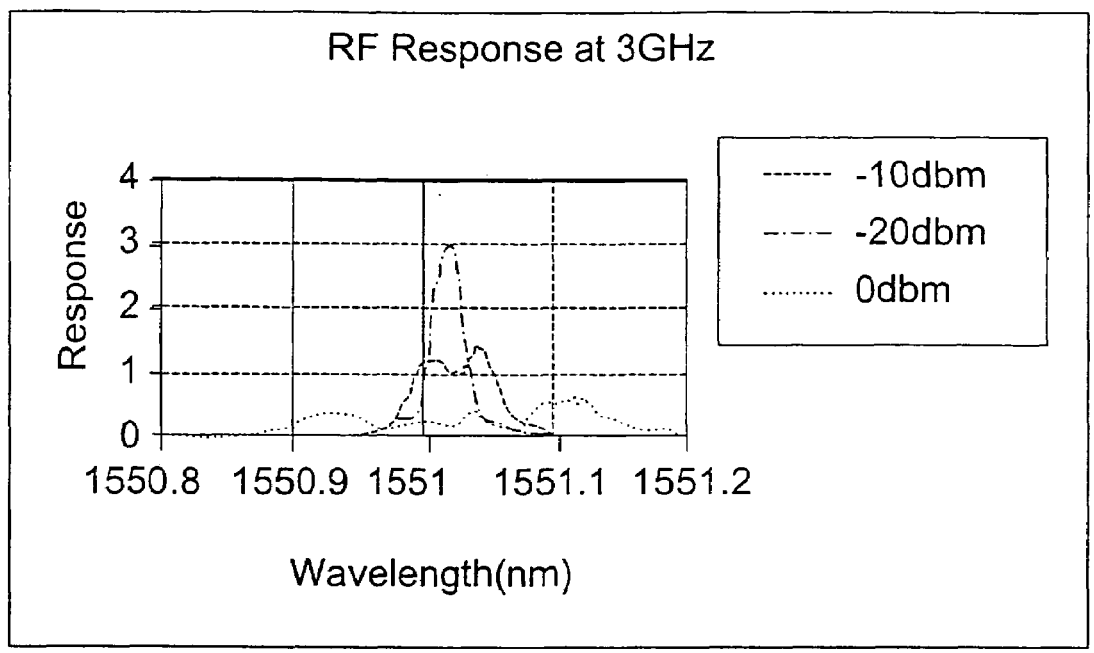
Figure 8C:
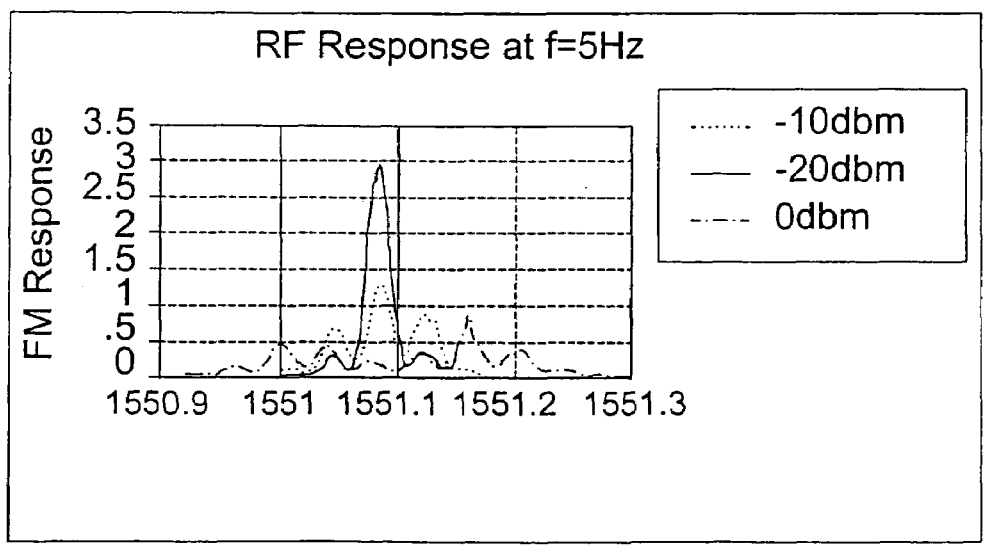

FIGS. 8(a)–8(c) are graphs showing the optical FM spectra of the laser of the present invention at different continuous wave (cw) modulation power and wavelengths/frequencies. FIGS. 8(a) and 8(b) show the spectrum obtained at an RF frequency of 3 GHz. FIG. 8(c) shows the spectrum obtained at an RF frequency of 5 Ghz.

Figure 9:
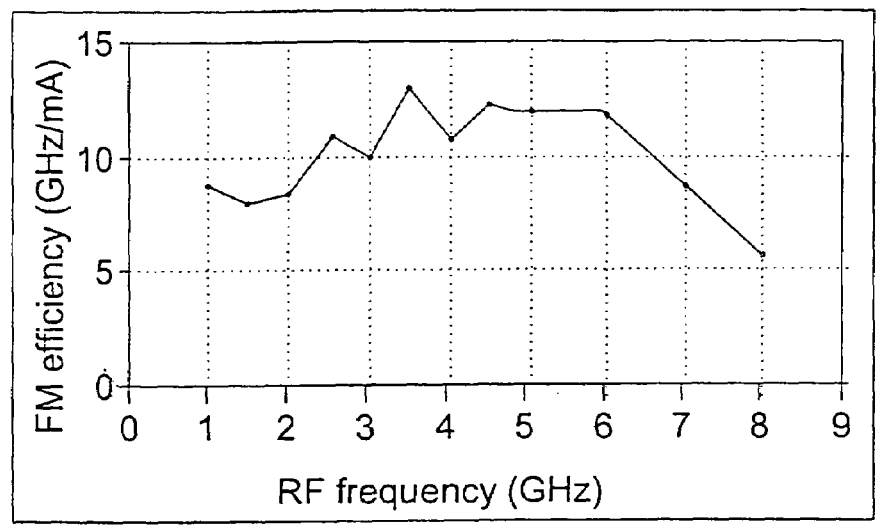
FIG. 9 is a graph showing measured FM efficiency (K) versus RF frequency obtained for the present invention.

FIG. 9 is a graph showing the measured FM efficiency (K) versus the RF frequency obtained for the present invention. The graph shows that the efficiency is very high (on the order of 200 GHz/V or 10 GHz/mA) and quite flat over 6 GHz bandwidth (less than 2 dB fluctuation from 2 GHz to 8 GHz).

Figure 10:
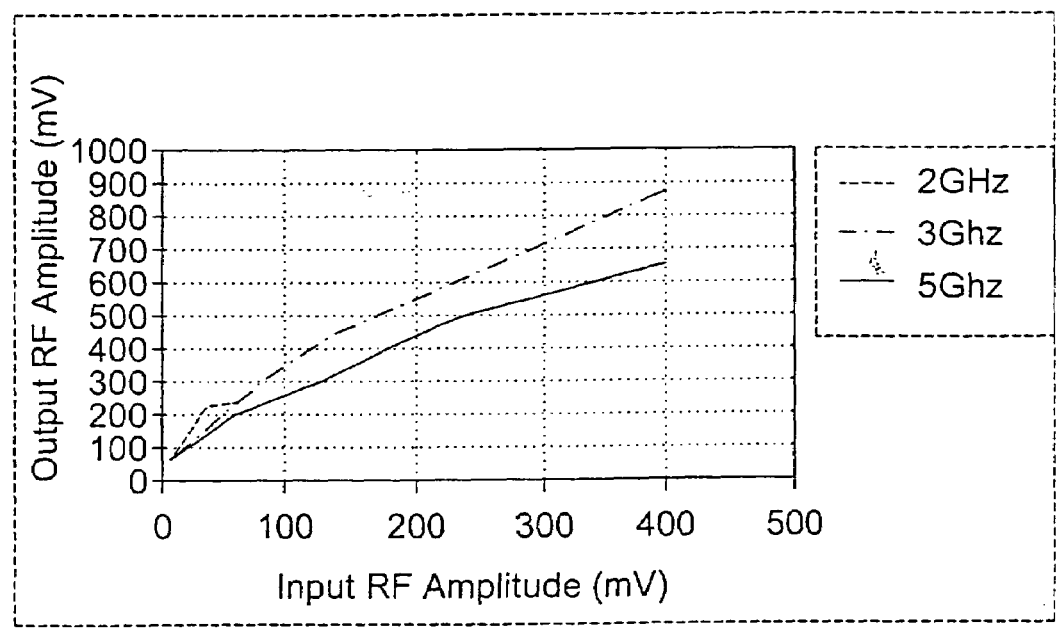
FIG. 10 is a graph showing measured RF gain corresponding to an AM signal generated and displayed on a oscilloscope in accordance with the present invention.

FIG. 10 is a graph showing the measured RF gain for the invention obtained from an oscilloscope. In this graph, the horizontal axis is the input RF power applied to the FM laser. The optical signal output from the laser in FM format is discriminated (converted to an AM signal) by the optical filter. The bandwidth of the optical filter is about 40 GHz, and the front edge of the filter was used to discriminate the FM signal. As previously explained, the output of the filter is in the AM format again. FIG. 10 shows this AM signal as detected and displayed on the oscilloscope. For the invention, about 10 dB of FM gain is observed when the RF frequency is approximately 2 to 3 Ghz.

Figure 11:
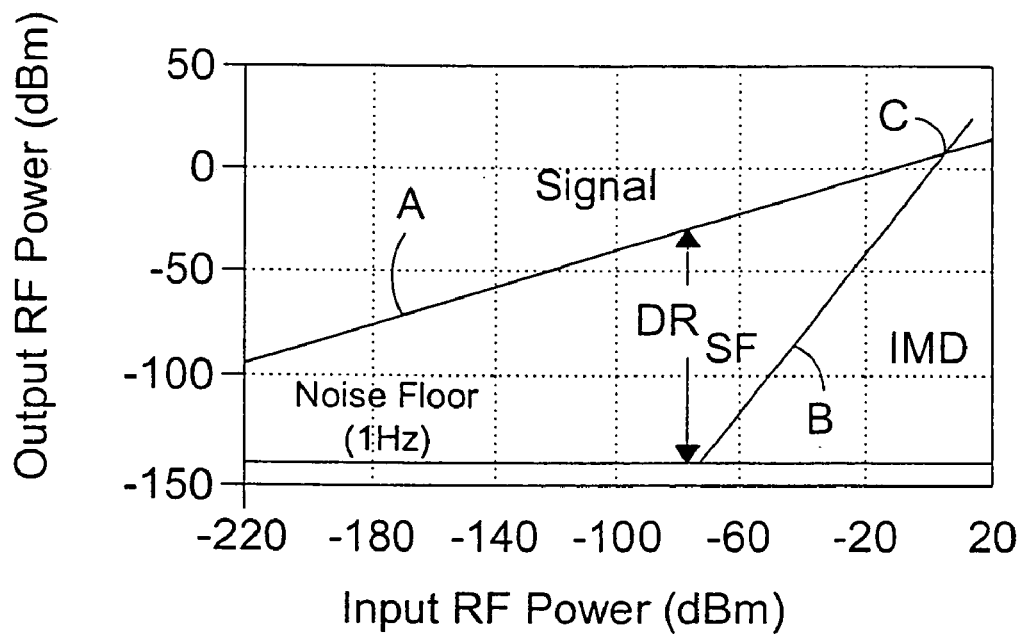
FIG. 11 is a graph showing a spurious-free dynamic range ($DR_{sf}$) characteristic with an RF power gain curve obtained for the present invention.

Since FM efficiency (K) varies with RF power, the RF gain also varies with RF power. As a result, a different spur-free dynamic range ($DR_{sp}$) characteristic is obtained compared with AM links. FIG. 11 shows this characteristic in a graph plotting RF power gain obtained for the present invention. As shown, this graph contains two curves (A and B) which correspond to spurious-free dynamic range ($DR_{sp}$) at a receiving power of −2.3 dBm (see point C). Two-tone RF signals ($f_1$=2 GHz and $f_2$=2.5 GHz) were used to achieve these results. The demodulated RF signal and the $3^{rd}$ order ($2f_1-f_2$, $2f_2-f_1$) inter-modulation distortion (IMD) are also plotted on this graph. The $DR_{sp}$ is defined as the largest output RF signal when IMD is below a laser noise floor.

When beat with an external cavity tunable laser (100 KHz line width), the measured laser linewidth (phase noise) is around 60 MHz. This contributed to the measured laser noise floor of −145 dBm/Hz. The spurious-free dynamic range $DR_{sp}$ is about 120 dB at 1 Hz bandwidth. The $DR_{sp}$ characteristic of the invention is different from the $DR_{sp}$ characteristics of conventional AM links in at least two significant ways. First, the invention obtains an RF gain which is positive and large (more than 10 dB gain) and the optical power at the detector is only −2.3 dBm. In contrast, the gain in most conventional AM links is negative. Second, in the invention the slope of the signal line is not unity because RF gain varies with input power. Conventional AM links cannot obtain this response.

Figure 12:
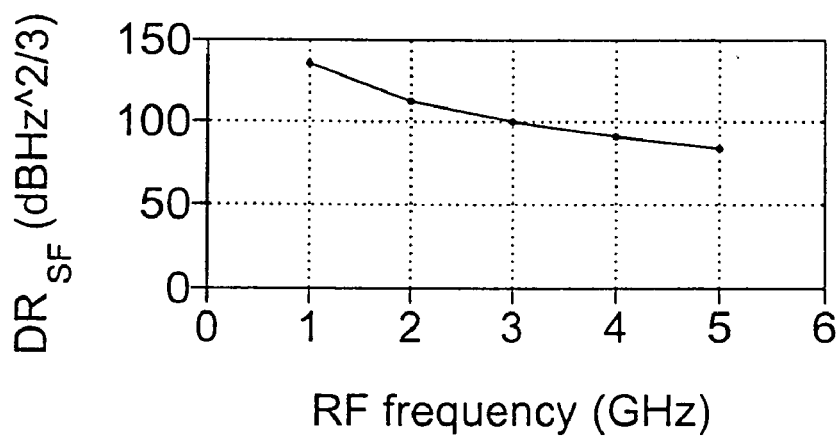
FIG. 12 is a graph showing the spurious-free dynamic range ($DR_{sf}$) characteristic obtained for the present invention at different RF frequencies.

FIG. 12 is a graph showing the spurious-free dynamic range obtained by the invention at different RF frequencies. As shown, more than 90 dB $DR_{sp}$ can be achieved up to 5 GHz. This result shows that the non-linearity of the system of the invention is reasonably good.

In summary, the FM modulated RF fiber-link of the present invention provides more than 10 dB link gain. Spurious-free dynamic range measured at different frequencies showed superior results compared with conventional systems, thereby making the invention suitable for use in both existing and further RF photonics applications. Experimental results also show that the FM laser device has a very large FM efficiency, well controlled by the applied voltage at different frequencies. The invention differs from previous explanations that the spectral broadening is caused by coherent collapse.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for generating an RF transmission signal, comprising:
    frequency modulating a carrier signal with an RF input signal to produce an FM signal, said carrier signal being an optical signal;
    converting frequency variations in the FM signal to amplitude variations in order to generate an amplitude-modulated optical signal; and
    transforming the AM optical signal to an RF output signal;
    wherein the converting step is characterized by an FM gain such that an amplitude of the RF output signal is greater than or equal to an amplitude of the RF input signal.

2. The method of claim 1, wherein said converting step is performed based on a transfer function which demonstrates a linear response within a predetermined bandwidth.

3. The method of claim 1, further comprising:
    altering a frequency used to perform said frequency-modulation step so that the RF output signal will have a desired power.

4. The method of claim 1, wherein said frequency-modulating step is performed by an FM laser having an output facet which does not include an anti-reflection coating.

5. The method of claim 1, further comprising:
    providing an FM laser fabricated using selective-area-growth techniques; and
    performing said frequency-modulating step using said FM laser.

6. The method of claim 1, wherein said step of converting frequency variations in the FM signal to amplitude variations is performed by a discriminator.

7. The method of claim 6, wherein the discriminator is an optical band pass filter, and wherein said converting step is performed based on one of a rising edge and a falling edge of said optical filter.

8. The method of claim 7, wherein said converting step is performed based on the rising edge of said optical filter.

9. The signal processor of claim 7, wherein said filter converts the frequency-modulated optical signal into said amplitude-modulated optical signal based on the rising edge of said filter.

10. The method of claim 6, wherein the discriminator is an interferometer.

11. A signal processing method, comprising:
    converting an RF input signal into a frequency-modulated optical signal;
    converting the frequency-modulated optical signal into an amplitude-modulated optical signal using an analog discriminator which operates using a linear transfer function within a predetermined bandwidth; and
    transforming the amplitude-modulated optical signal to an RF output signal;
    wherein the second converting step is characterized by an FM gain such that an amplitude of the RF output signal is greater than or equal to an amplitude of the RF input signal.

12. The method of claim 11, further comprising:
    altering a frequency used to frequency-modulate the RF signal so that the amplitude-modulated optical signal will have a desired power.

13. The method of claim 11, wherein the first converting step is performed by an FM laser having an output facet which does not include an anti-reflection coating.

14. The method of claim 11, further comprising:
    providing an FM laser fabricated using selective-area-growth techniques; and performing the first converting step using said FM laser.

15. The method of claim 11, wherein the second converting step is performed by a discriminator.

16. The method of claim 15, wherein the discriminator is an optical band pass filter, and wherein the second converting step is performed based on one of a rising edge and a falling edge of said optical filter.

17. The method of claim 16, wherein the second converting step is performed based on the rising edge of said optical filter.

18. The method of claim 15, wherein the discriminator is an interferometer.

19. A signal transmitter, comprising:
    an FM modulator which frequency modulates light with a RF input signal to produce an FM optical signal;
    a discriminator which converts frequency variations in the FM optical signal to amplitude variations, thereby producing an amplitude-modulated optical signal; and
    a detector which converts the amplitude-modulated optical signal into an RF output signal for transmission;
    wherein the discriminator is characterized by an FM gain such that an amplitude of the RF output signal is greater than or equal to an amplitude of the RF input signal.

20. The signal transmitter of claim 19, wherein said discriminator converts frequency variation in the FM optical signal to an amplitude variation using a linear transfer function within a predetermined bandwidth.

21. The signal transmitter of claim 19, further comprising:
    means for altering a frequency used to frequency-modulate the RF signal so that the amplitude-modulated optical signal will have a desired power.

22. The signal transmitter of claim 19, wherein said FM modulator is an integrated DFB laser/modulator device.

23. The signal transmitter of claim 22, wherein said DFB laser/modulator device has an output facet which does not include an anti-reflective (AR) coating.

24. The signal transmitter of claim 19, wherein the discriminator is an optical band pass filter which converts the frequency-modulated optical signal into said amplitude-modulated optical signal based on one of a rising edge and a falling edge of said filter.

25. The signal transmitter of claim 24, wherein said filter converts the frequency-modulated optical signal into said amplitude-modulated optical signal based on the rising edge of said filter.

26. The signal transmitter of claim 19, wherein the discriminator is an interferometer.

27. A signal processor, comprising:
    a first converter which converts an RF input signal into a frequency-modulated optical signal; and
    a second converter which converts the frequency-modulated optical signal into an amplitude-modulated optical signal using an analog discriminator which operates using a linear transfer function within a predetermined bandwidth; and a detector which converts the amplitude-modulated optical signal into an RF output signal for transmission;

wherein the second converter is characterized by an FM gain such that an amplitude of the RF output signal is greater than or equal to an amplitude of the RF input signal.

28. The signal processor of claim 27, further comprising:
means for altering a frequency used to frequency-modulate the RF signal so that the amplitude-modulated optical signal will have a desired power.

29. The signal processor of claim 27, wherein said first converter is an integrated DFB laser/modulator device.

30. The signal processor of claim 29, wherein said DFB laser/modulator device has an output facet which does not include an and-reflective (AR) coating.

31. The signal processor of claim 27, wherein the second converter is a discriminator.

32. The signal processor of claim 31, wherein the discriminator is an optical band pass filter which converts the frequency-modulated optical signal into said amplitude-modulated optical signal based on one of a rising edge and a falling edge of said filter.

33. The signal processor of claim 31, wherein the discriminator is an interferometer.

34. A laser, comprising:

an FM modulator which frequency modulates light with a RF input signal to produce an FM optical signal; and a discriminator which converts frequency variations in the FM optical signal to amplitude variations, thereby producing an amplitude-modulated optical signal said discriminator converting said frequency variations in the FM optical signal to amplitude variations based on a linear transfer function; and a detector which converts the amplitude-modulated optical signal into an RF output signal for transmission;

wherein the second converter is characterized by an FM gain such that an amplitude of the RF output signal is greater than or equal to an amplitude of the RF input signal.

* * * * *